US010452585B2

United States Patent
Suzuki et al.

(10) Patent No.: US 10,452,585 B2
(45) Date of Patent: Oct. 22, 2019

(54) CROSSBAR SWITCH WITH PIPELINE DELAY REGISTERS

(71) Applicant: HEWLETT PACKARD ENTERPRISE DEVELOPMENT LP, Houston, TX (US)

(72) Inventors: Shiro Suzuki, Roseville, CA (US); Jonathan Greenlaw, Roseville, CA (US); Mark Shillingburg, Roseville, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 219 days.

(21) Appl. No.: 15/267,786

(22) Filed: Sep. 16, 2016

(65) Prior Publication Data
US 2018/0081845 A1    Mar. 22, 2018

(51) Int. Cl.
*G06F 13/40* (2006.01)
*G06F 17/50* (2006.01)
*H04L 12/933* (2013.01)

(52) U.S. Cl.
CPC ...... *G06F 13/4022* (2013.01); *G06F 13/4068* (2013.01); *G06F 17/5068* (2013.01); *H04L 49/101* (2013.01)

(58) Field of Classification Search
CPC ............. G06F 13/4022; G06F 13/4068; G06F 17/5068; H04L 49/101
See application file for complete search history.

(56) References Cited

U.S. PATENT DOCUMENTS

| | | | | |
|---|---|---|---|---|
| 4,727,424 A | * | 2/1988 | Chao ...................... | H04N 5/211 348/614 |
| 4,807,183 A | * | 2/1989 | Kung .................. | G06F 13/4022 708/404 |

(Continued)

FOREIGN PATENT DOCUMENTS

WO      WO-9207335      4/1992

OTHER PUBLICATIONS

Giorgos Passas et al., "A 123×128×24Gb/s Crossbar Interconnecting 128 tiles in a single hop and Occupying 6% of their area," NOCS 2010, May 2010, Grenoble, France, pp. 1-9, ACM/IEEE.

(Continued)

*Primary Examiner* — Farley Abad
*Assistant Examiner* — Henry W Yu
(74) *Attorney, Agent, or Firm* — Hewlett Packard Enterprise Patent Department

(57) ABSTRACT

Examples herein relate to crossbar switches and related circuitry. An example crossbar switch includes a plurality of abutted tiles forming a crossbar. The plurality of abutted tiles includes a plurality of edge tiles and at least one middle tile, where each side of each middle tile abuts an edge tile or another middle tile. Each middle tile includes data inputs connected to data outputs, switched data inputs connected to switched data outputs, and pipeline delay registers coupled to data inputs and switched data outputs to allow transmission of a data signal to change directions inside each middle tile. Each edge tile includes a crossbar input, a crossbar output, and a set of inputs, outputs, and pipeline delay registers to allow transmission of data signals from any side of the edge tile to any other side of the edge tile.

19 Claims, 6 Drawing Sheets

(56) References Cited

U.S. PATENT DOCUMENTS

| | | | | |
|---|---|---|---|---|
| 5,594,363 | A * | 1/1997 | Freeman | H03K 19/17704 326/39 |
| 6,557,070 | B1 | 4/2003 | Noel, Jr. | |
| 6,636,932 | B1 * | 10/2003 | Regev | H04L 45/60 370/250 |
| 6,759,869 | B1 * | 7/2004 | Young | H03K 19/17736 326/38 |
| 7,203,789 | B2 | 4/2007 | Snider | |
| 7,224,184 | B1 | 5/2007 | Levi | |
| 8,127,111 | B1 | 2/2012 | Wentzlaff et al. | |
| 8,462,777 | B2 * | 6/2013 | Khanduri | H04Q 3/68 370/387 |
| 8,503,217 | B2 * | 8/2013 | Yi | G11C 13/0007 365/148 |
| 2003/0131200 | A1 * | 7/2003 | Berg | G06F 12/0813 711/141 |
| 2005/0258872 | A1 * | 11/2005 | Snider | B82Y 10/00 326/101 |
| 2014/0103959 | A1 | 4/2014 | Andreev | |
| 2014/0122560 | A1 * | 5/2014 | Ramey | G06F 15/17312 709/201 |
| 2014/0156929 | A1 | 6/2014 | Falsafi et al. | |
| 2014/0376557 | A1 * | 12/2014 | Park | G06F 15/17381 370/400 |
| 2016/0336050 | A1 * | 11/2016 | Li | G11C 7/10 |

OTHER PUBLICATIONS

Korey Sewell et al., "Swizzle-switch Networks for Many-core Systems," IEEE Journal on Emerging and Selected Topics in Circuits and Systems, Jun. 2012, pp. 278-294, vol. 1, No. 2, IEEE.

Yi-Huang Hung et al., "Dangling-wire Avoidance Routing for crossbar Switch Structured ASIC Design Style," pp. 177-180, IEEE.

European Patent Office, Extended European Search Report, dated Feb. 6, 2018, Application No. 17191218.1-1215, 6 Pgs.

* cited by examiner

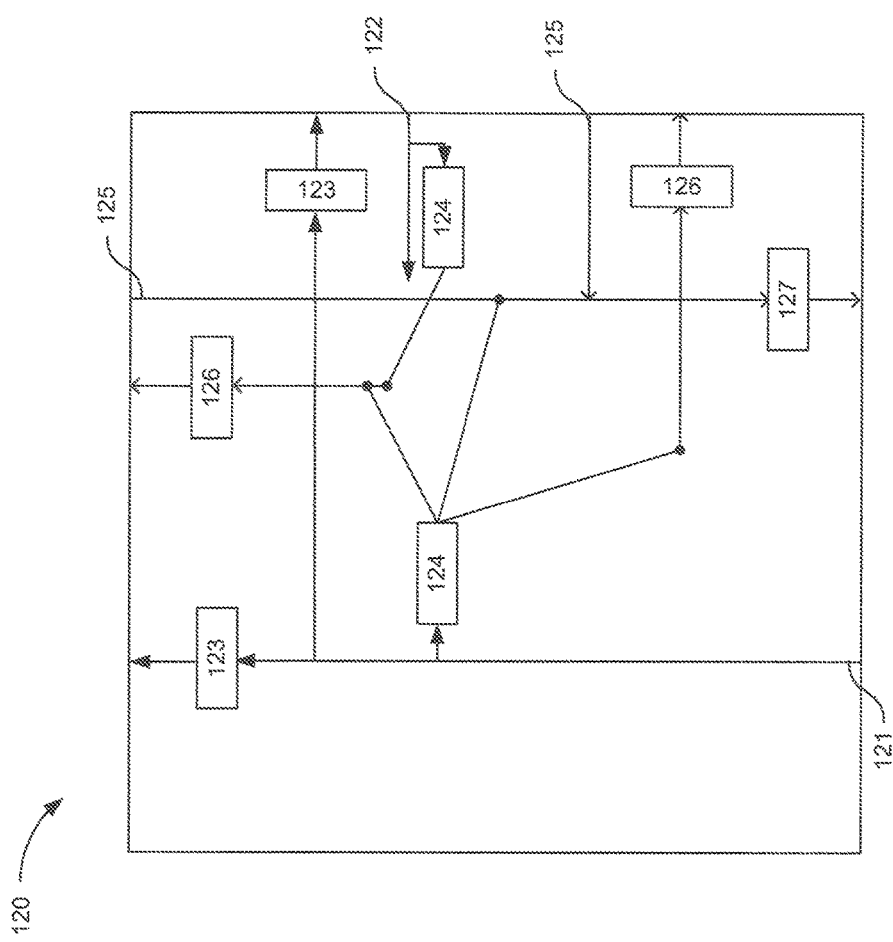

the plurality of abutted tiles. In this manner, examples herein may enforce pipelining at each tile, reduce wiring congestion, and allow even distribution of inputs and outputs associated with all directions of a switch.

CROSSBAR SWITCH WITH PIPELINE DELAY REGISTERS

BACKGROUND

Crossbar switches are used in information processing applications such as circuit switching. Crossbar switches include a collection of switches arranged in a matrix configuration and may be implemented in solid state semiconductor chips, including in application specific integrated circuits.

BRIEF DESCRIPTION OF THE DRAWINGS

The following detailed description references the drawings, wherein:

FIG. 1C is a schematic circuit diagram of an example edge tile of an example crossbar switch;

DETAILED DESCRIPTION

Non-blocking crossbar switches are often elements of switching systems. Crossbar switches are a collection of switches arranged in a matrix configuration. A crossbar switch may have multiple input and output lines that form a crossed pattern of interconnecting lines between which a connection may be established at each intersection, which are the elements of the matrix. Crossbar switch topologies may be implemented in solid state semiconductor chips.

However, several challenges exists for implementing high density crossbar switches in such systems as application specific integrated circuits (ASIC) and system on a chip (SoC). For example, many existing crossbar switches are combinatorial while many ASIC technologies use pipelined communication. Crossbar switches may have topologies where all inputs are connected to all outputs, causing wiring congestions without a systematic wiring design. Furthermore, existing crossbar switches may have inputs on one edge and outputs on another edge, yet ASIC systems may utilize bidirectional links that allow even distribution of inputs and outputs on the edges.

Examples disclosed herein address these technical challenges by providing for crossbar switches with a tileable crossbar architecture suitable for high speed, high density, and low latency. Example crossbar switches may include a plurality of abutted tiles forming a crossbar. The plurality of abutted tiles may include a plurality of edge tiles and at least one middle tile, where each side of each middle tile abuts an edge tile or another middle tile. Each middle tile may include data inputs connected to data outputs, switched data inputs connected to switched data outputs, and pipeline delay registers coupled to data inputs and switched data outputs to allow transmission of a data signal to change directions inside each middle tile. Each edge tile may include a crossbar input, a crossbar output, and a set of inputs, outputs, and pipeline delay registers to allow transmission of data signals from any side of the edge tile to any other side of the edge tile abutting one of the plurality of abutted tiles. In this manner, examples herein may enforce pipelining at each tile, reduce wiring congestion, and allow even distribution of inputs and outputs associated with all directions of a switch.

Figure 1A:
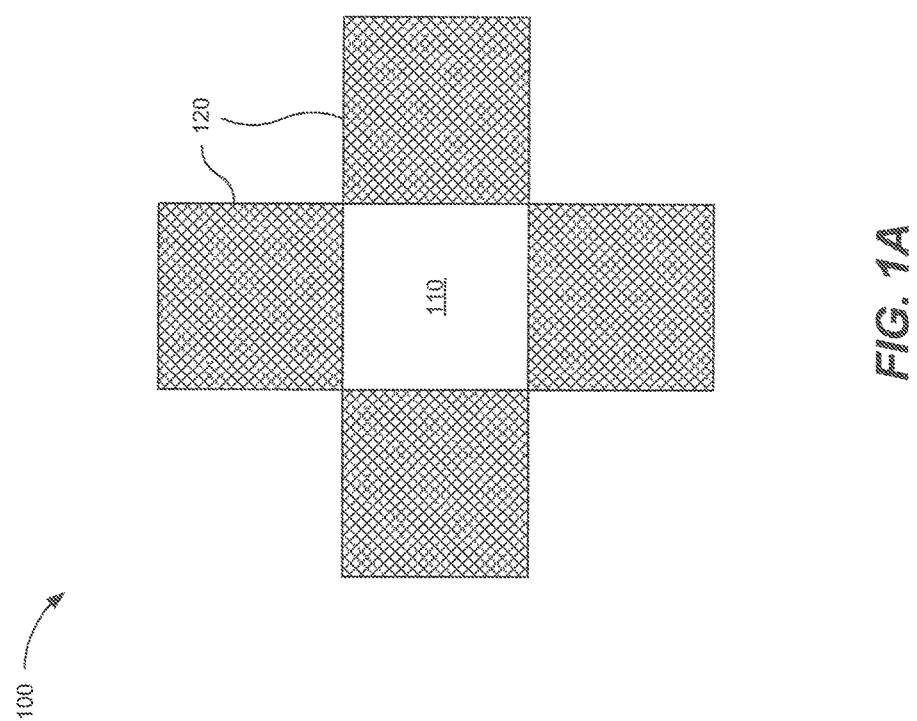
FIG. 1A is a schematic diagram of an example crossbar switch.

Referring now to the drawings, FIG. 1A illustrates an example crossbar switch 100. Crossbar switch 100 may be a collection of switches arranged in a matrix configuration. Crossbar switch 100 may be an electrical component that can break an electrical circuit and divert current from one conductor to another. As described in detail herein, crossbar switch 100 may have multiple inputs and outputs that form a crossed pattern of interconnecting lines between which a connection may be established.

As illustrated in by FIG. 1A, crossbar switch 100 may have a plurality of abutted tiles. Each tile of the plurality of abutted tiles may be a component and/or piece of the overall crossbar array 100. By dividing the architecture of the crossbar switch into parts, the abutted tiles allow for segregation of the circuit design of the overall switch. For example, the circuitry that allows for transmission and routing of data through the crossbar switch 100 can be confined to and for each tile. When the tiles are configured in an abutted topology, the separate tiles together may operate to implement the overall crossbar switch 100. For instance, the tiles together allow an input from any crossbar input of the switch to be routed to any crossbar output of the switch. A specific example of this is illustrated herein and described in detail below. Furthermore, in some examples, the concept of abutted tiles do not necessarily represent physical components of the crossbar switch 100. For example, abutted tiles may represent conceptual partitions of the overall crossbar switch architecture and may not include any physical separation.

The plurality of abutted tiles of crossbar switch 100 may include a plurality of edge tiles 120 and at least one middle tile 110, where each middle tile 110 abuts an edge tile 120 or another middle tile. As illustrated in FIG. 1A, crossbar switch 100 is segregated into four rectangular edge tiles 120 abutting a rectangular middle tile 110. Middle tile 110 may include a data input on each side of the tile connected to a data output on each opposite side of the tile, a switched data input on each side of the tile connected to a switched data output on each opposite side of the tile, and a pipeline delay register coupled to each data input and each switched data output not on the same side of the tile as the data input and the data output. In this manner, the middle tile 110 allows the transmission of a data signal entering through any data input or switched data input to any data output or switched data output by allowing the data signal to change directions inside the tile. Details of an example architecture topology of example middle tiles 110 is further described in relation to FIGS. 1B and 1D.

Similarly, each edge tile 120 of crossbar switch 100 may include a crossbar input, a crossbar output, and a set of inputs, outputs, and pipeline delay registers to allow a transmission of a data signal from any side of the edge tile 120 to any other side of the edge tile 120 abutting one of the plurality of abutted tiles. Therefore in this manner, each edge tile 120 allows transmission of a data signal entering through the crossbar input, a data input, or a switched data input to any data output, switched data output, or the crossbar output by allowing the data signal to change directions inside the tile. Details of the architecture topology of example edge tiles 120 is further described in relation to FIGS. 1C and 1D.

The architecture of the tiles Crossbar switch 100 may operate as a switching fabric that provides connectivity between nodes in a system. Crossbar switch 100 may have a crossbar input and a crossbar output in each edge tile 120. Each of the crossbar inputs and outputs may act as an external interface to other devices or components of a system. For example, these interfaces may include Ethernet connections, PCI, PCI-Express, or other interfaces. Each crossbar input may be routable to any crossbar output in the crossbar switch 100. In some examples, each crossbar input may be routable to any crossbar output in any of the other sides of the switch as the particular crossbar input.

In some examples, each side of the crossbar array may have multiple crossbar inputs. For example, each of the four edge tiles 120 of crossbar switch 100 may have a plurality of crossbar inputs. As a specific example, each edge tile 120 may have twelve crossbar inputs connected to twelve data outputs on the side of the edge tile abutting the middle tile 110 by a channel for data signal transmission. In some examples, the channels may be bidirectional, multi-bit data channels. The twelve data outputs of each edge tile 120 may be coupled to data inputs of the middle tile 110. In this example, middle tile 110 of crossbar array 100 may include twelve data inputs on each side of the tile connected to twelve data outputs on each opposite side of the tile and forty-eight (number of sides of tile times the number of data inputs on each side of the tile) pipeline delay registers where each pipeline delay register connects one of the data inputs to its corresponding data output and to a switched data output on the two sides of the middle tile 110 that is not connected by the one of the data inputs and its corresponding data output. In such a manner, any data input of the middle tile 110 abutting an edge tile can be routable to any other edge tile 120 to which it abuts. It should be noted that in some examples, each data input, data output, switched data input, and/or switched data output may include a bus, such as a plurality of conductors which in parallel carry an input or output. For example, each input or output may be 128 bit wide.

Thus in this specific example of FIG. 1A, each edge tile 120 may have twelve crossbar inputs, twelve data outputs on the side of the tile abutting the middle tile 110 connected to the crossbar inputs, twelve switched data inputs on the side of the tile abutting the middle tile 110, and twelve crossbar outputs connected to the switched data outputs. The middle tile 110 may have twelve data inputs on each side connected by a data channel to twelve data outputs on each opposite side and forty-eight pipeline delay registers coupling each data input to its corresponding data output and to the twelve switched data outputs on each side of the middle tile.

In addition to facilitating the routing of data signals, the pipeline delay registers coupled to data inputs may actuate pipelining of the data signals. In addition to routing the signals, the pipeline delay registers may have a programmed delay for a signal packet that allows the packet to traverse each tile of the switch in a particular time period, such as a clock cycle. The pipeline delay may simplify control of the switch by ensuring that the signal packets arrive at crossbar outputs intact and at the correct clock cycle. As explained in further detail below, in some examples, each data signal packet may include a fabric transport header (FTH) that affects, among other things, the destination edge tile and crossbar output for the packet.

Figure 1B:
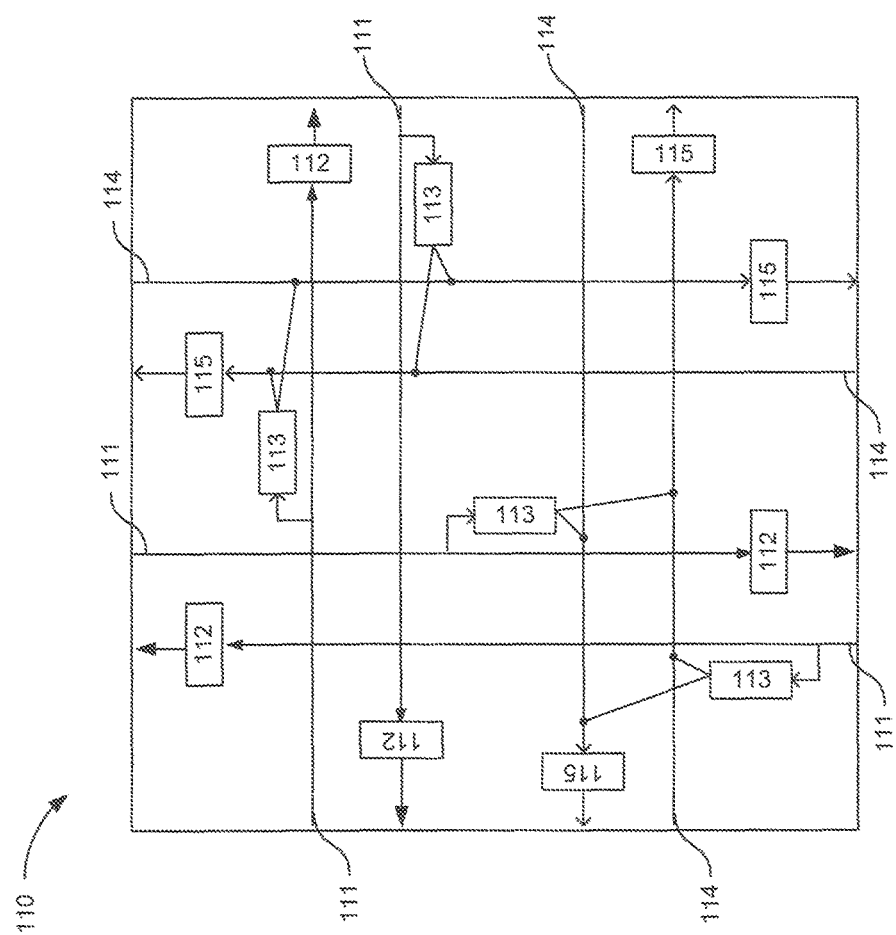
FIG. 1B is a schematic circuit diagram of an example middle tile of an example crossbar switch.

FIG. 1B illustrates a schematic circuit topology of an example middle tile of an example crossbar switch, such as middle tile 110 of crossbar switch 100. In some examples, middle tile 110 may be abutted by edge tiles or alternatively by other middle tiles 110. Middle tile 110 may include a data input 111 on each side of the tile connected to a data output 112 on each opposite side of the tile by a data channel. In implementations where middle tile 110 abuts other middle tiles, middle tile 110 may include a switched data input 114 on each side of the tile connected to a switched data output 115 on each opposite side of the tile by a data channel (in instances where middle tile 110 abuts edge tiles, the middle tile may not have switched data inputs, but may have switched data outputs). Middle tile 110 may include a number of pipeline delay registers 113 equal to the number of sides of the tile (4) multiplied by the number of data inputs on each side (1). Each pipeline delay register 113 may be coupled to a data input 111 and each switched data output 115 not the same side of the tile as the data input 111 and the data output 112 to allow transmission of a data signal to change directions inside the middle tile 110. In this way, a data signal entering any data input 111 can exit the tile via the data output 112 connected to the data input 111 or either one of the two switched data outputs 115 that is coupled to the data input 111 via the corresponding pipeline delay register 113. In some examples, a signal that had previously been routed by a pipeline delay register in another tile may enter the middle tile 110 through one of the switched data inputs 114 and exit through the switched data output 115 connected to that switched data input 114.

FIG. 1C illustrates a schematic circuit topology of an example edge tile of an example crossbar switch, such as edge tile 120 of crossbar switch 100. Edge tile 120 may be abutted on one or more sides by a middle tile or another edge tile. Edge tile 120 may have a crossbar input 121, a crossbar output 127, and a set of inputs (122 and 125), outputs (123 and 126), and pipeline delay registers 124 to allow transmission of a data signal from any side of the edge tile 120 to any other side of the edge tile abutting one of the plurality of abutted tiles. In the illustrated example of FIG. 1C, edge tile 120 is abutted on the top and right sides by a middle tile, such as middle tile 110.

In some examples, crossbar input 121 is connected to data outputs 123 on each side of the edge tile abutting a middle tile. The crossbar input 121 may be coupled to a pipeline delay register 124 that can route a data signal to switched data outputs 126. A data input 122 from a middle tile 122 may be coupled by a pipeline delay register 124 to a switched data output 126. Switched data inputs 125 may be connected to crossbar output 127. In some examples, such as the one shown, crossbar input 121 and crossbar output 127 may be located on the same edge of the edge tile 127.

Figure 1D:
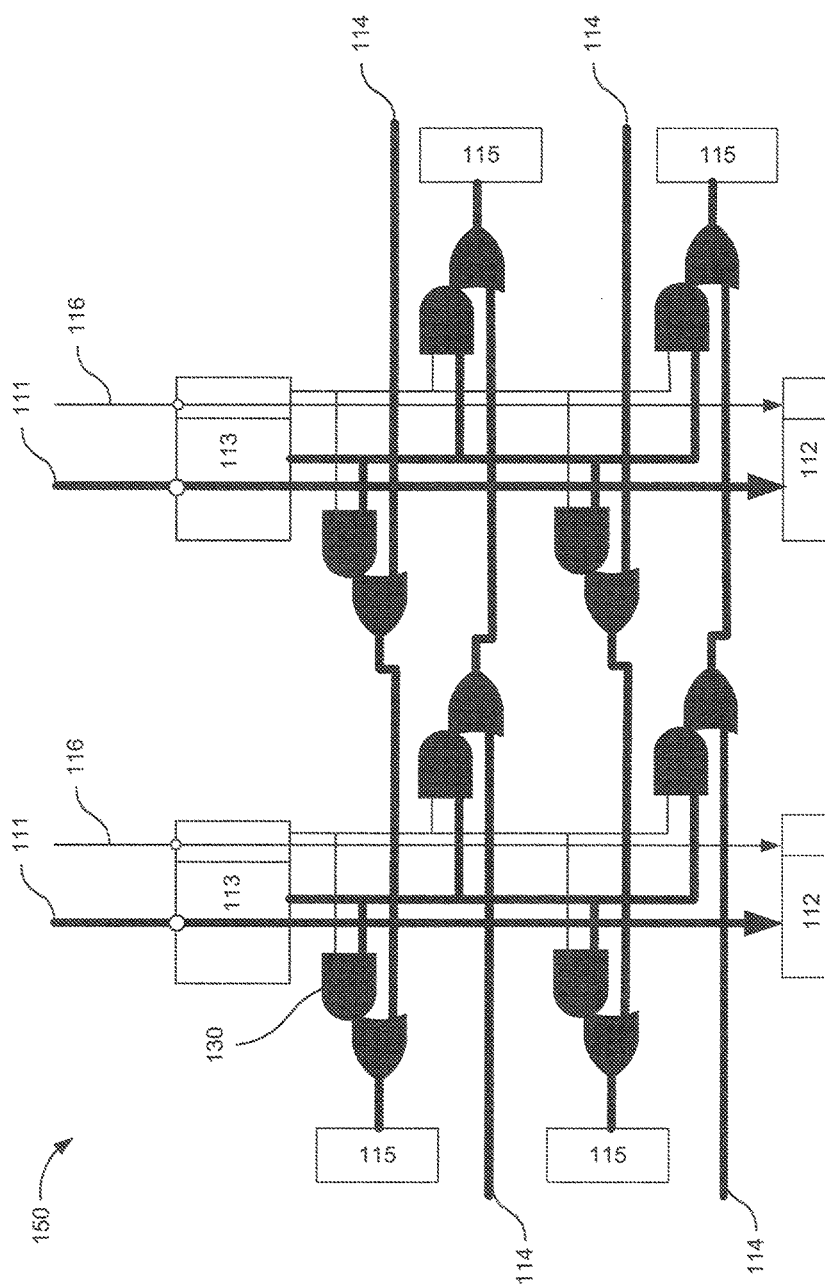
FIG. 1D is a circuit diagram of an example set of data inputs and outputs in an example tile of an example crossbar switch.

FIG. 1D illustrates a circuit diagram 150 of an example set of data inputs and outputs of an example tile of an example crossbar switch, such as crossbar switch 100. Circuit diagram 150 shows an example circuit topology for a set of two data inputs 111 on one side of a tile, such as an example middle tile 110 of crossbar switch 100. The two data inputs 111 are connected to two data outputs 112 on the opposite side of the tile. The two other sides of the tile may each have two switched data inputs 114 connected to two switched data outputs 115 on each opposite side. Switched data inputs 114 may receive data signals from other tiles that were previously switched from their initial paths by pipeline delay registers in the other tiles. Furthermore, each data input 111 may be coupled by a pipeline delay register 113 to each switched data output 115. For example, each data input 111 illustrated in FIG. 1D may be coupled to four switched data outputs 115 by its pipeline delay register 113.

A large data packet may be divided into segmented data signal packets that are communicated through a crossbar switch. Such a data signal packet may include a fabric transport header (FTH) that affects, among other things, the destination edge tile and crossbar output for the packet. For example, an arbiter of the crossbar switch may use a node identification of the FTH to determine a destination index. The destination index may travel with each data signal packet, as represented by 116 in FIG. 1D. The destination index may indicate to pipeline delay register 113 whether the data packet transmitting from data input 111 is to be routed to one of the switched data outputs 114. If the destination index does not indicate a change of direction, then the data packet may continue to data output 112. Otherwise, the destination index may route the data packet by sending an indication to one of four AND gates 130 connecting to the data channel of each switched data output 115. If both the data packet and the destination index are received by a particular AND gate 130, then the data packet may be redirected to the switched data output associated with that AND gate 130.

The circuit topology shown in FIG. 1D only represents the circuitry associated with the data inputs of one side of the tile. In a middle tile having four sides, the circuit topology may have four replications of the circuitry shown in FIG. 1D, each rotated 90 degrees from one another and one for each side of the tile. The middle tile would have two data inputs 111 on each side of the tile connected to two data outputs 112 on each opposite side of the tile, and a total of eight pipeline delay registers 113 directing data signals from and to any direction in the tile.

Figure 2A:
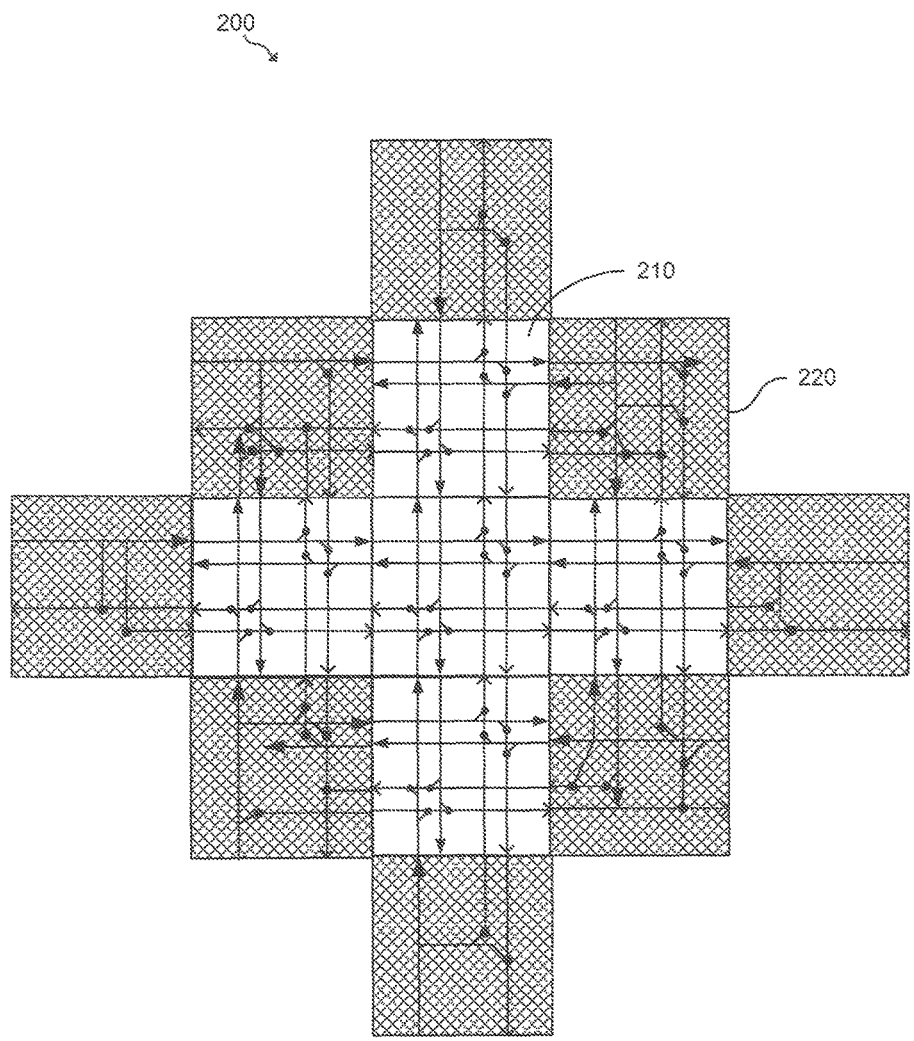
FIG. 2A is a schematic diagram of an example crossbar switch having eight edge tiles and five middle tiles.

FIG. 2A illustrates an example crossbar switch 200 having eight edge tiles 220 and five middle tiles 210. The abutment of the edge tiles and middle tiles allows the confinement of the circuitry for routing data packets from any crossbar input to any crossbar output to each particular tile. Crossbar switch 200 may have crossbar inputs in each edge tile 220 so that there are two edge tiles for each direction of crossbar input. For example, FIG. 2A illustrates that two edge tiles 220 have crossbar inputs from the left direction, two have crossbar inputs from the top, two have crossbar inputs from the right, and two have crossbar inputs from the bottom.

Each middle tile 210 may include data inputs connected to data outputs, switched data inputs connected to switched data outputs, and pipeline delay registers coupled to data inputs and switched data outputs to allow transmission of a data signal to change directions inside each middle tile. Similarly, each edge tile 220 may include a crossbar input, a crossbar output, and a set of inputs, outputs, and pipeline delay registers to allow transmission of data signals from any side of the edge tile to any other side of the edge tile. Each middle tile 210 may have a circuit topology analogous to that illustrated in FIGS. 1B and 1D, and each edge tile may have a circuit topology analogous to that illustrated in FIGS. 1C and 1D.

Figure 2B:
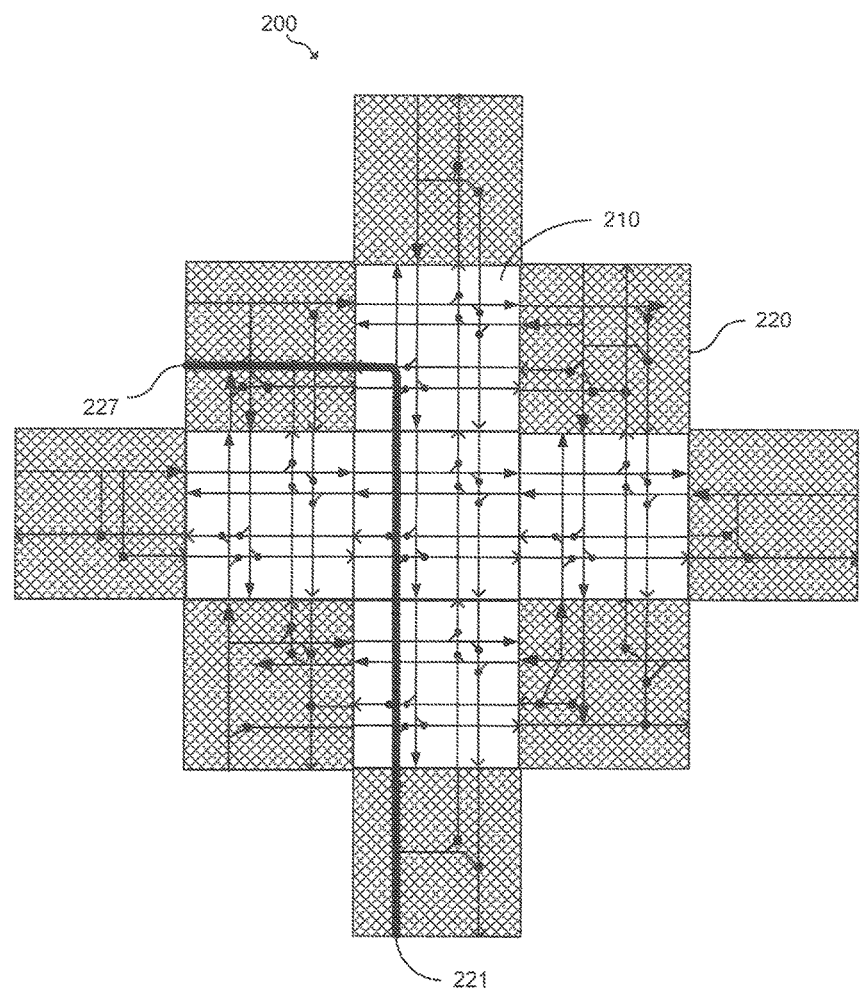
FIG. 2B is a schematic diagram of an example crossbar switch having eight edge tiles and five middle tiles showing a data signal transmitting in a particular path through the example crossbar switch.

FIG. 2B illustrates a data signal transmitting in a particular path through an example crossbar switch having eight edge tiles 220 and five middle tiles 210, such as crossbar switch 200 illustrated in FIG. 2A. For example, a user may want a data signal that originates from a node connected to crossbar input 221 on the bottom-most edge tile 220 to route to a crossbar out 227 on another edge tile 221 coupled to a second node.

Upon entering the crossbar switch 200 at crossbar input 221, a data packet, along with its destination index, may traverse through the originating edge tile, through a first middle tile, and second middle tile without its destination index indicating a reroute of the data packet. Upon reaching a pipeline delay register coupled to the data input of the third middle tile, the destination index triggers the data packet to route to a switched data output of the third middle tile going towards the left direction. Upon entering and traversing the destination edge tile through a switched data input, the packet leaves the destination edge tile via crossbar output 227.

The foregoing describes a number of examples for crossbar switches. It should be understood that the examples described herein may include additional components and that some of the components described herein may be removed or modified without departing from the scope of the examples or their applications. It should also be understood that the components depicted in the figures are not drawn to scale, and thus, the components may have different relative sizes with respect to each other than as shown in the figures.

Further, the sequence of operations described in connection with FIGS. 1-2 are examples and are not intended to be limiting. Additional or fewer operations or combinations of operations may be used or may vary without departing from the scope of the disclosed examples. Furthermore, implementations consistent with the disclosed examples need not perform the sequence of operations in any particular order. Thus, the present disclosure merely sets forth possible examples of implementations, and many variations and modifications may be made to the described examples. All such modifications and variations are intended to be included within the scope of this disclosure and protected by the following claims.

It should further be noted that, as used in this application and the appended claims, the singular forms "a," "an," and "the" include plural elements unless the context clearly dictates otherwise.

What is claimed is:
1. A crossbar switch, comprising:
a plurality of abutted tiles forming a crossbar, the plurality of abutted tiles comprising a plurality of edge tiles and at least one middle tile, wherein:
each side of each middle tile abuts an edge tile or another middle tile;
each middle tile includes:
a data input on each side of the tile connected to a data output on each opposite side of the middle tile;
a switched data input on each side of the tile connected to a switched data output on each opposite side of the middle tile; and
a pipeline delay register, coupled to each data input and each switched data output not on the same side of the middle tile as the data input and the data output, to allow a transmission of a data signal to change directions inside each middle tile and to allow the transmission of the data signal to be delayed based on a programmed delay; and
each edge tile includes:
a crossbar input;
a crossbar output;
a set of inputs, outputs, and pipeline delay registers to allow a transmission of a data signal from any side of the edge tile to any other side of the edge tile abutting one of the plurality of abutted tiles.
2. The crossbar switch of claim 1, wherein each of the plurality of abutted tiles are rectangular.

3. The crossbar switch of claim 1, wherein the crossbar input and the crossbar output are located on the same side of each edge tile.

4. The crossbar switch of claim 1, wherein each middle tile of the plurality of abutted tiles comprises a plurality of data inputs on each side, a plurality of data outputs on each side, a plurality of switched data inputs on each side, a plurality of switched data outputs on each side, and a plurality of pipeline delay registers equal to the number of data inputs on each side multiplied by the number of sides of each tile.

5. The crossbar switch of claim 1, wherein each pair of data inputs and data outputs is connected by a channel for transmission of data signals, and each pair of switched data inputs and switched data outputs is connected by a channel for transmission of the data signal.

6. The crossbar switch of claim 5, wherein the destination index of the data signal indicates the direction to which a transmission of a data signal is to change.

7. The crossbar switch of claim 5, wherein the plurality of channels connecting each pair of data inputs and data outputs and connecting each pair of switched data inputs and switched data outputs comprises twelve bidirectional data channels.

8. The crossbar switch of claim 1, wherein each of the plurality of abutted tiles allows pipelining of a data signal.

9. A circuit, comprising a crossbar switch, the crossbar switch comprising:
a plurality of abutted rectangular tiles forming a crossbar, the plurality of abutted rectangular tiles comprising a plurality of edge tiles and at least one middle tile, wherein:
each side of each middle tile abuts an edge tile or another middle tile;
each middle tile includes:
a data input on each side of the tile connected to a data output on each opposite side of the middle tile;
a switched data input on each side of the tile connected to a switched data output on each opposite side of the middle tile; and
a pipeline delay register coupled to each data input and each switched data output not on the same side of the middle tile as the data input and the data output,
wherein the pipeline delay registers allow a transmission of a data signal to change directions inside each middle tile and allow the transmission of the data signal to be delayed based on, at least, a destination index of the data signal; and
each edge tile, includes:
a crossbar input;
a crossbar output; and
a set of inputs, outputs, and pipeline delay registers to allow a transmission of a data signal from any side of the edge tile to any other side of the edge tile abutting one of the plurality of rectangular abutted tiles and to allow the transmission of the data signal from any side of the edge tile to be delayed based on, at least, a destination index of the data signal; and
each of the plurality of abutted tiles allows pipelining of the data signal.

10. The circuit of claim 9, wherein the crossbar input and the crossbar output are located on the same side of each edge tile.

11. The circuit of claim 9, wherein each middle tile of the plurality of abutted rectangular tiles comprises a plurality of data inputs on each side, a plurality of data outputs on each side, a plurality of switched data inputs on each side, a plurality of switched data outputs on each side, and a plurality of pipeline delay registers equal to the number of data inputs on each side multiplied by the number of sides of each tile.

12. The circuit of claim 9, wherein each pair of data inputs and data outputs is connected by a channel for transmission of data signals, each pair of switched data inputs and switched data outputs is connected by a channel for transmission of data signals, and the data signals include the destination index indicating the direction to which a transmission of a data signal is to change.

13. An application specific integrated circuit, comprising a crossbar switch, the crossbar switching comprising:
a plurality of abutted rectangular tiles forming a crossbar, the plurality of abutted rectangular tiles comprising a plurality of edge tiles and at least one middle tile, wherein:
each side of each middle tile abuts an edge tile or another middle tile;
each middle tile includes:
a data input on each side of the tile connected to a data output on each opposite side of the middle tile;
a switched data input on each side of the tile connected to a switched data output on each opposite side of the middle tile; and
a pipeline delay register coupled to each data input and each switched data output not on the same side of the middle tile as the data input and the data output, wherein the pipeline delay registers allow a transmission of a data signal to change directions inside each middle tile and allow the transmission of the data signal to be delayed based on a first programmed delay and a destination index of the data signal; and
each edge tile includes:
a crossbar input and a crossbar output located on the same side of each edge tile; and
a set of inputs, outputs, and pipeline delay registers to allow a transmission of a data signal from any side of the edge tile to any other side of the edge tile abutting another one of the plurality of abutted rectangular tiles and to allow the transmission of the data signal from any side of the edge tile to be delayed based on a second programmed delay and the destination index of the data signal; and
each of the plurality of abutted tiles allows pipelining of the data signal.

14. The application specific integrated circuit of claim 13, wherein each middle tile of the plurality of abutted rectangular tiles comprises a plurality of data inputs on each side, a plurality of data outputs on each side, a plurality of switched data inputs on each side, a plurality of switched data outputs on each side, and a plurality of pipeline delay registers equal to the number of data inputs on each side multiplied by the number of sides of each tile.

15. The application specific integrated circuit of claim 13, wherein each pair of data inputs and data outputs is connected by a channel for transmission of the data signal, each pair of switched data inputs and switched data outputs is connected by a channel for transmission of the data signal, and the data signal includes the destination index indicating the direction to which a transmission of the data signal is to change.

16. The crossbar switch of claim 1, wherein the plurality of abutted tiles are not physically separated.

17. The crossbar switch of claim 1, wherein the programmed delay is based on clock cycles.

18. The crossbar switch of claim 6, wherein the pipeline delay register may transfer the data signal to a specific abutted tile based on destination index.

19. The crossbar switch of claim 6, wherein the destination index is included in a transport header of the data signal.

* * * * *